United States Patent
Koch et al.

(10) Patent No.: US 11,813,958 B2
(45) Date of Patent: Nov. 14, 2023

(54) AUTOMATED REFERENCE ELECTRODE MANAGEMENT

(71) Applicant: GM GLOBAL TECHNOLOGY OPERATIONS LLC, Detroit, MI (US)

(72) Inventors: Brian J. Koch, Berkley, MI (US); Jing Gao, Rochester, MI (US); Alfred Zhang, Troy, MI (US); Alok Warey, Novi, MI (US); Jason Graetz, Calabasas, CA (US); Chia-Ming Chang, Agoura Hills, CA (US); Daniel M. Zehnder, Los Angeles, CA (US); Patrick J. Webb, Los Angeles, CA (US); Souren Soukiazian, Burbank, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/478,292

(22) Filed: Sep. 17, 2021

(65) Prior Publication Data
US 2023/0090433 A1   Mar. 23, 2023

(51) Int. Cl.
*B60L 58/12* (2019.01)
*G01R 19/165* (2006.01)

(52) U.S. Cl.
CPC ........ *B60L 58/12* (2019.02); *G01R 19/16566* (2013.01); *B60L 2240/547* (2013.01)

(58) Field of Classification Search
CPC ............... B60L 58/12; B60L 2240/547; G01R 19/16566

USPC ........................................................ 320/132
See application file for complete search history.

(56) References Cited

U.S. PATENT DOCUMENTS

| | | | |
|---|---|---|---|
| 8,163,410 B2 | 4/2012 | Fulop et al. | |
| 8,541,122 B2 | 9/2013 | Fulop et al. | |
| 10,418,622 B2 | 9/2019 | Koch et al. | |
| 10,439,256 B2 | 10/2019 | Koch et al. | |
| 10,446,883 B2 | 10/2019 | Spigno et al. | |
| 10,700,376 B2 | 6/2020 | Koch | |
| 2009/0104510 A1* | 4/2009 | Fulop | H02J 7/00 429/50 |
| 2011/0250478 A1* | 10/2011 | Timmons | H01M 4/5825 429/91 |
| 2013/0323542 A1* | 12/2013 | Wijayawardhana | H01M 10/48 324/426 |
| 2014/0375325 A1* | 12/2014 | Wang | H01M 10/425 324/426 |
| 2015/0111077 A1 | 4/2015 | Paik et al. | |
| 2015/0147614 A1* | 5/2015 | Wang | G01R 31/382 429/93 |
| 2019/0072613 A1* | 3/2019 | Schmidt | G01R 31/3835 |
| 2020/0366112 A1 | 11/2020 | Koch et al. | |
| 2021/0091424 A1 | 3/2021 | Gao et al. | |

* cited by examiner

*Primary Examiner* — Paul Dinh
(74) *Attorney, Agent, or Firm* — CANTOR COLBURN LLP

(57) ABSTRACT

A vehicle, and a balancing device and method of controlling a state of charge of a reference electrode in a battery. The balancing device includes a measurement circuit and a charging circuit. The measurement circuit is configured to obtain a measurement of a reference voltage of the reference electrode. The charging circuit is configured to adjust the reference voltage based on the measurement. The state of charge of the reference electrode is controlled based on the reference voltage.

20 Claims, 6 Drawing Sheets

AUTOMATED REFERENCE ELECTRODE MANAGEMENT

INTRODUCTION

The subject disclosure relates to battery testing and charge maintenance and, in particular, to a system and method for determining and controlling a state of charge on a reference electrode of a battery.

A state of charge of a lithium-ion battery can be estimated by measuring a voltage difference between a cathode and an anode of the battery. However, this voltage can change due to a charge or discharge event. To obtain improved voltage measurements, the cathode and anode voltages are often determined by measuring their voltages with respect to a reference electrode which is not involved in the energy storage process. The usefulness of the reference electrode depends upon its ability to maintain a stable electrochemical potential over time. However, for a reference electrode made of a lithium compound, the potential of the reference electrode depends on its lithium concentration, which changes over time. Accordingly, it is desirable to maintain control of the lithium concentration in the reference electrode.

SUMMARY

In one exemplary embodiment, a method of controlling a state of charge of a reference electrode in a battery is disclosed. A measurement is obtained of a reference voltage of the reference electrode. The reference voltage is adjusted based on the measurement. The state of charge of the reference electrode is controlled based on the reference voltage.

In addition to one or more of the features described herein, the reference electrode is made of Lithium-Ion Phosphate (LiFePO4). The method further includes adjusting the reference voltage when the measurement is outside of a range defined about a nominal voltage. The range is defined by a maximum voltage threshold and a minimum voltage threshold. Adjusting the reference voltage further includes at least one of adding a lithium ion to the reference electrode and removing the lithium ion from the reference electrode. Adjusting the reference voltage further includes at least one of charging the reference electrode from an anode of the battery, discharging the reference electrode to a cathode of the battery, charging the reference electrode from the cathode of the battery, and discharging the reference electrode to the anode of the battery. The method further includes determining at least one of a cathode voltage and an anode voltage using the reference voltage.

In another exemplary embodiment, a balancing device for controlling a state of charge of a reference electrode in a battery is disclosed. The balancing device includes a measurement circuit and a charging circuit. The measurement circuit is configured to obtain a measurement of a reference voltage of the reference electrode. The charging circuit is configured to adjust the reference voltage based on the measurement, wherein the state of charge of the reference electrode is controlled based on the reference voltage.

In addition to one or more of the features described herein, the reference electrode is made of Lithium-Ion Phosphate (LiFePO4). The charging circuit is configured to adjust the reference voltage when the measurement is outside of a range defined about a nominal voltage. The range is defined by a maximum voltage threshold and a minimum voltage threshold. The charging circuit is configured to adjust the reference voltage by performing at least one of adding a lithium ion to the reference electrode and removing the lithium ion from the reference electrode. The charging circuit is configured to adjust the reference voltage by performing at least one of charging the reference electrode from an anode of the battery, discharging the reference electrode to a cathode of the battery, charging the reference electrode from the cathode of the battery, and discharging the reference electrode to the anode of the battery. The measurement circuit is configured to determine at least one a cathode voltage and an anode voltage using the reference voltage.

In yet another exemplary embodiment, a vehicle is disclosed. The vehicle includes a battery and a balancing device. The battery has a state of charge and a reference electrode. The balancing device controls the state of charge of the reference electrode. The balancing device includes a measurement circuit and a charging circuit. The measurement circuit is configured to obtain a measurement of a reference voltage of the reference electrode. The charging circuit is configured to adjust the reference voltage based on the measurement, wherein the state of charge of the reference electrode is controlled based on the reference voltage.

In addition to one or more of the features described herein, the reference electrode is made of Lithium-Ion Phosphate (LiFePO4). The charging circuit is configured to adjust the reference voltage when the measurement is outside of a range defined by a maximum voltage threshold and a minimum voltage threshold about a nominal voltage. The charging circuit is configured to adjust the reference voltage by performing at least one of adding a lithium ion to the reference electrode and removing the lithium ion from the reference electrode. The charging circuit is configured to adjust the reference voltage by performing at least one of charging the reference electrode from an anode of the battery, discharging the reference electrode to a cathode of the battery, charging the reference electrode from the cathode of the battery, and discharging the reference electrode to the anode of the battery. The measurement circuit is configured to determine at least one a cathode voltage and an anode voltage using the reference voltage.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
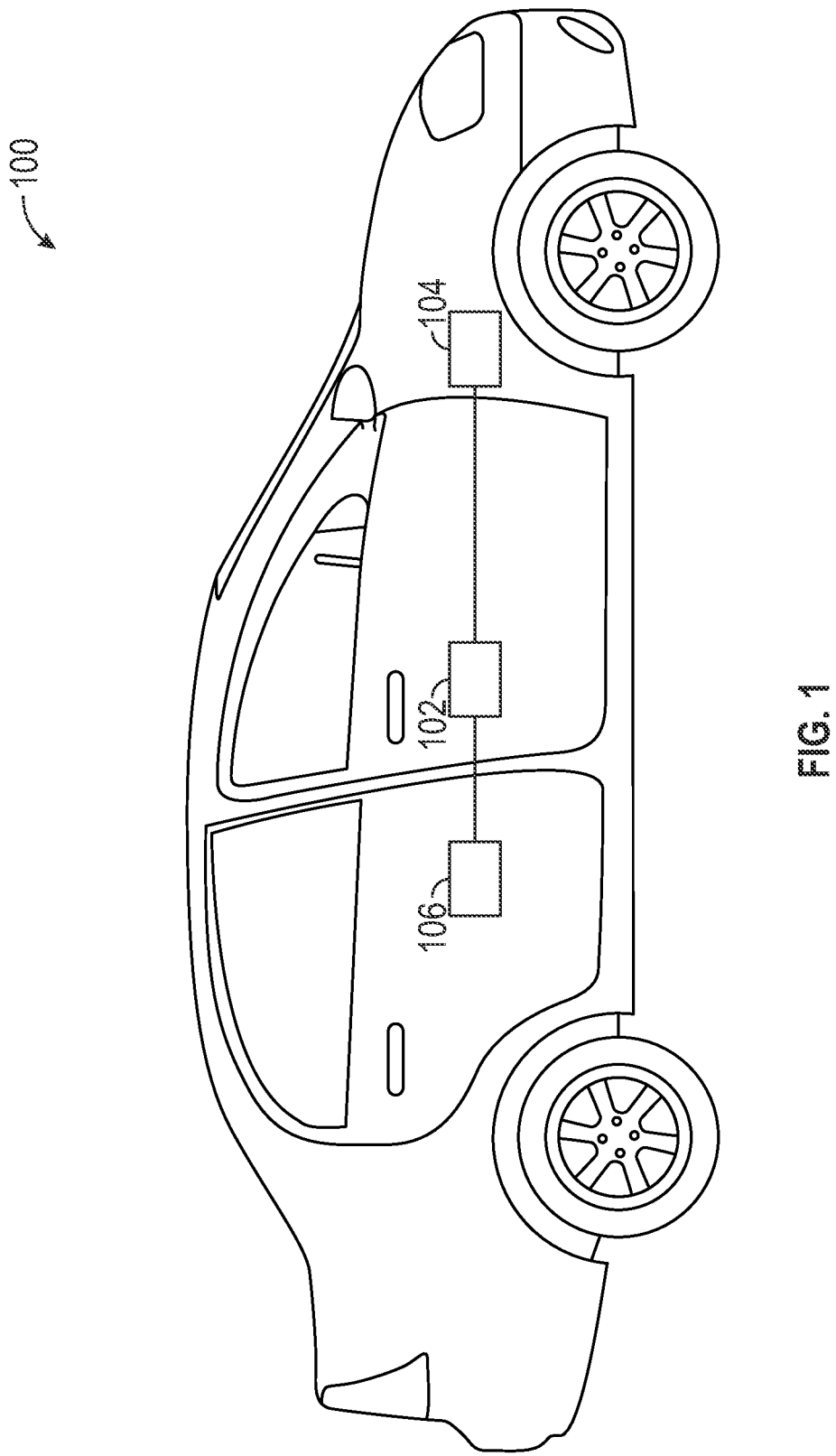
FIG. 1 shows a vehicle in an illustrative embodiment.

The following description is merely exemplary in nature and is not intended to limit the present disclosure, its application or uses. It should be understood that throughout the drawings, corresponding reference numerals indicate like or corresponding parts and features.

In accordance with an exemplary embodiment FIG. 1 shows a vehicle 100. The vehicle 100 includes a battery pack 102, an electrical load 104 and a balancing device 106. In various embodiments, the battery pack 102 is a Lithium battery. The battery pack 102 supplies electrical power to the electrical load 104. The electrical load 104 can include a motor and/or an electrical device, such as radio, communication systems, lights, computer processors, etc. In an embodiment, in which the vehicle 100 includes an electrical motor for propulsion, the battery pack 102 can supply power for propulsion, etc. The balancing device 106 performs various measurements to determine a state of charge of the battery pack 102. In one embodiment, the balancing device 106 obtains a measurement of a reference voltage of a reference electrode disposed in the battery pack 102. The balancing device 106 can also charge or discharge the reference electrode to adjust the reference voltage to within a standard of nominal voltage and monitor the state of charge of the battery pack 102 based on the reference voltage obtained via the adjustment. While the balancing device 106 is shown in FIG. 1 as being a component of the vehicle 100, the balancing device 106 can be part of a station independent of the vehicle, such as a repair station or a recharging station, in various embodiments.

Figure 2:
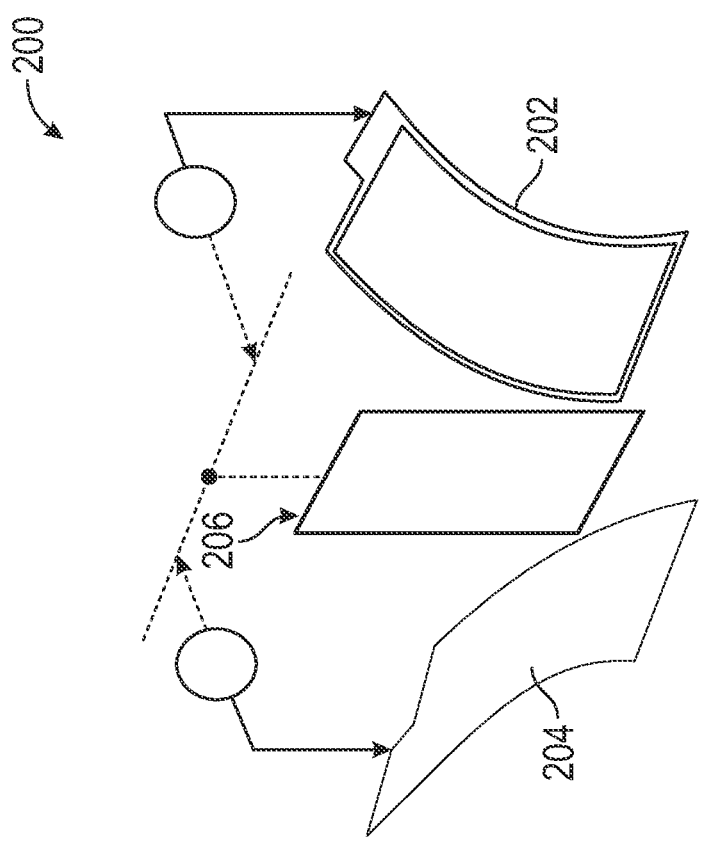
FIG. 2 shows a diagram of a battery cell of the battery pack.

FIG. 2 shows a diagram of a battery cell 200 of the battery pack 102. The battery cell 200 includes a cathode 202, an anode 204, and a reference electrode 206 generally disposed between the cathode 202 and the anode 204. A state of charge of the battery cell 200 is determined by measuring a cathode voltage and an anode voltage. The cathode voltage is measured between the cathode 202 and the reference electrode 206, and an anode voltage is measured between the anode 204 and the reference electrode 206.

Figure 3:
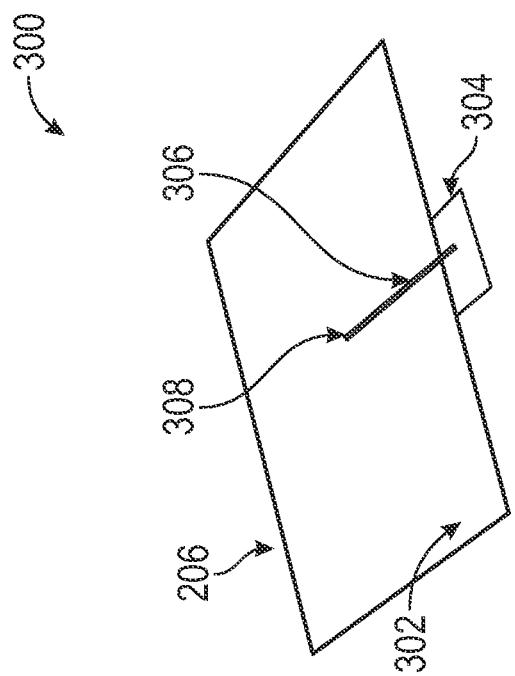
FIG. 3 shows a detailed view of the reference electrode of FIG. 2 in an illustrative embodiment.

FIG. 3 shows a detailed view 300 of the reference electrode 206 of FIG. 2 in an illustrative embodiment. The reference electrode 206 includes a separator sheet 302 that holds a reference strip 304 in place. The reference strip 304 includes a conductive strip 306 connected to a reference material 308. In various embodiments, the conductive strip 306 is made of a gold (Au) and the reference material 308 is made of lithium-ion phosphate (LiFePO4).

Figure 4:
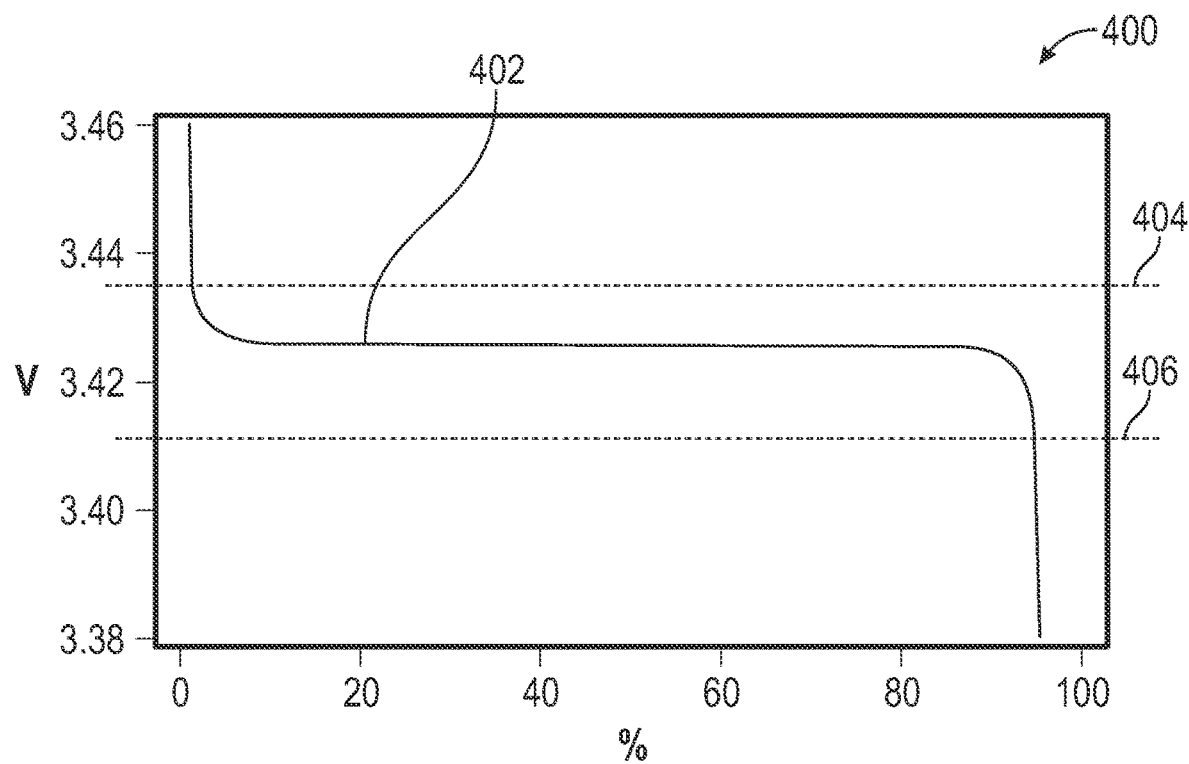
FIG. 4 shows a graph illustrating a relation between a reference voltage of the reference electrode and a depth of discharge of the reference electrode.

FIG. 4 shows a graph 400 illustrating a relation between reference voltage (i.e., the electric potential of the reference electrode 206) of the reference electrode and a depth of discharge of the reference electrode. The depth of discharge is the amount of charge that has been removed from a fully charged battery. Depth of discharge is shown as a percentage (%) along the abscissa and voltage is shown in volts (V) along the ordinate axis.

Curve 402 represents a reference voltage of the reference electrode 206 as a function of the depth of discharge. As seen from curve 402, the reference voltage is stable over a wide range of depth of discharge (e.g., between about 5% and about 95%) and stays within a tight voltage range of the nominal voltage (e.g., about 3.35 V) over this range. As the depth of discharge decrease below about 5%, the reference voltage quickly increases out of this range. As the depth of discharge increase above about 95%, the reference voltage quickly decreases out of this range.

Graph 400 includes a maximum voltage threshold 404 ($VT_{max}$) and a minimum voltage threshold 406 ($VT_{min}$). In various embodiments, the maximum voltage threshold 404 is about 3.434 V and the minimum voltage threshold 406 is about 3.410 V. The maximum voltage threshold 404 and the minimum voltage threshold 406 can be used to activate a charging and/or discharging event. When the reference voltage of curve 402 rises above the maximum voltage threshold 404, the balancing device 106 can take an action to lower the reference voltage, thereby restoring the reference voltage to its nominal value. When the reference voltage drops below the minimum voltage threshold 406, the balancing device 106 can take an action to raise the reference voltage, thereby restoring the reference voltage to its nominal value. Thus, an action is taken when the reference voltage lies outside of a voltage range defined about the nominal value.

Figure 5:
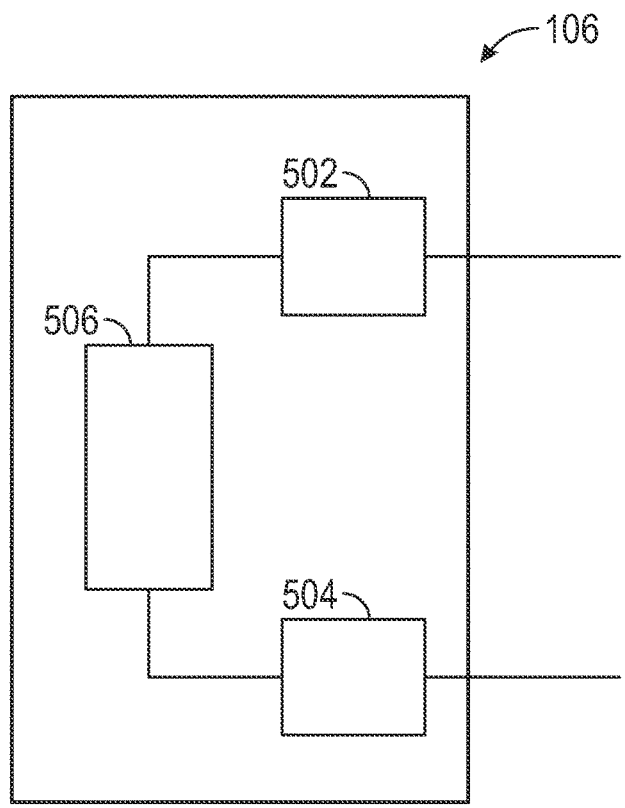
FIG. 5 shows a schematic diagram of a balancing device in an illustrative embodiment.

FIG. 5 shows a schematic diagram of a balancing device 106 in an illustrative embodiment. This balancing device 106 periodically measures the reference voltage under a known condition and adds or removes lithium to the reference electrode to recover the nominal potential when the reference voltage is outside of a selected range from the nominal potential. The range is indicated by the maximum voltage threshold 404 and the minimum voltage threshold 406. The balancing device 106 restores the reference voltage by either adding or removing lithium to the reference electrode 206. Once the reference voltage is restored, it can be used to determine the anode voltage and/or the cathode voltage and thus the state of charge of the battery cell 200.

The balancing device 106 includes a measurement circuit 502, a charging circuit 504 and a processor 506. The measurement circuit 502 is electrically coupled to the reference electrode 206 and obtains a measurement of the reference voltage. The charging circuit 504 controls a flow of lithium ions into and out of the reference electrode 206. For example, the charging circuit 504 can discharge the reference electrode 206 to the cathode 202 to transfer lithium ions out of the reference electrode. The measurement circuit 502 checks the reference voltage periodically. Charging/discharging occurs when the reference voltage differs from the nominal voltage by a selected amount.

In various embodiments, the measurement circuit 502 can also be used to measure a voltage difference between the reference electrode 206 and the anode 204 (i.e., the anode voltage) and to measure a voltage difference between the reference electrode 206 and the cathode 202 (i.e., the cathode voltage). The charging circuit 504 can also be used to control the state of charge of the reference electrode 206.

The processor 506 obtains the measurement of the reference voltage from the measurement circuit 502 and controls the operation of the charging circuit 504 based on the measurement. For example, when the reference voltage is greater than the maximum voltage threshold (e.g., about 3.434 V), the charging circuit 504 can discharge the reference electrode 206 to the anode 204 to add lithium ions to the reference electrode 206 to lower the reference voltage. When the reference voltage is less than the minimum voltage threshold (e.g., about 3.410 V), the lithium ions can be removed from the reference electrode 206 to raise the reference voltage. The charging circuit 504 can charge or discharge the reference electrode 206 using either the cathode 202 or the anode 204.

Figure 6:
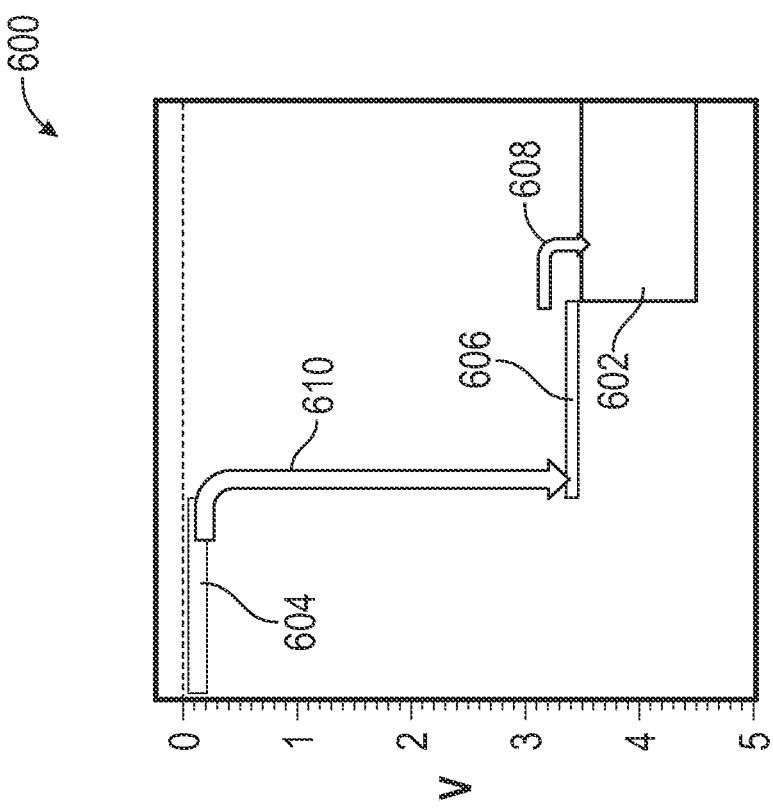
FIG. 6 shows a graph illustrating a discharge step that can be used to control or adjust a reference voltage.

FIG. 6 shows a plot 600 illustrating a discharge step that can be used to control or adjust a reference voltage. Potential (V) is shown along the y-axis and representative battery elements are distributed along the x-axis for ease of illustration. Cathode voltage 602 represents a voltage range of the cathode 202. Anode voltage 604 represents a voltage range of the anode. Reference voltage 606 represents a voltage range of the reference electrode 206. In various embodiments, the discharge step can be performed without the use of an additional power source. A cathode discharge step 608 includes discharging the reference electrode 206 to the cathode 202 and removes one or more lithium ions from the reference electrode. An anode discharge step 610 includes discharging the reference electrode 206 to the anode 204 and adds one or more lithium ions into the reference electrode.

Figure 7:
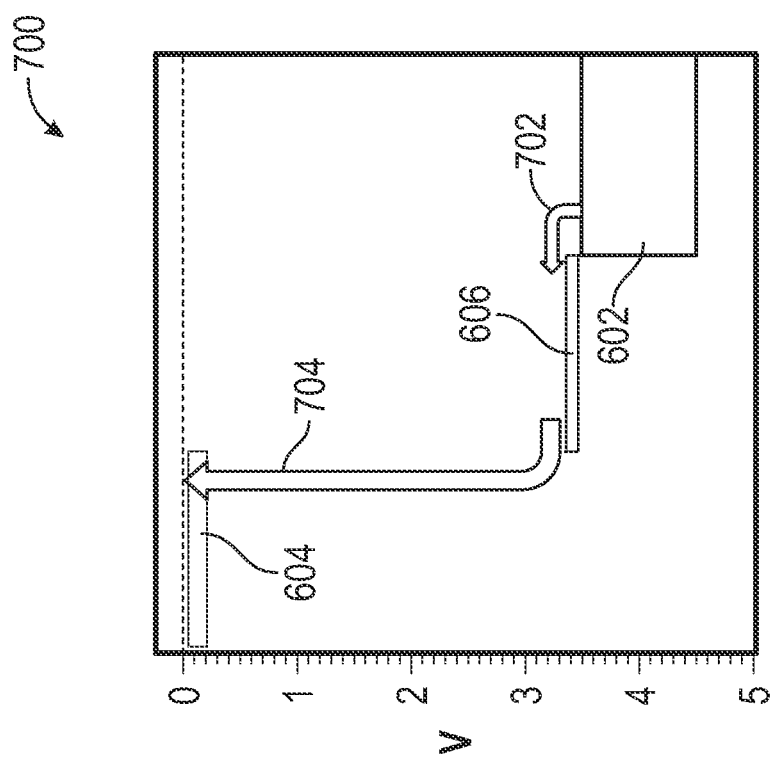
FIG. 7 shows a graph illustrating a charge step that can be used to control or adjust a reference voltage.

FIG. 7 shows a plot 700 illustrating a charge step that can be used to control or adjust a reference voltage. Potential (V) is shown along the y-axis and representative battery elements are distributed along the x-axis for ease of illustration. The charge step is performed via use of a current source and controller. A cathode charge step 702 includes charging the reference electrode 206 via the cathode 202 and adds one or more lithium ions to the reference electrode. An anode charge step 704 includes charging the reference electrode 206 using the anode 204 and removes one or more lithium ions from the reference electrode.

Figure 8:
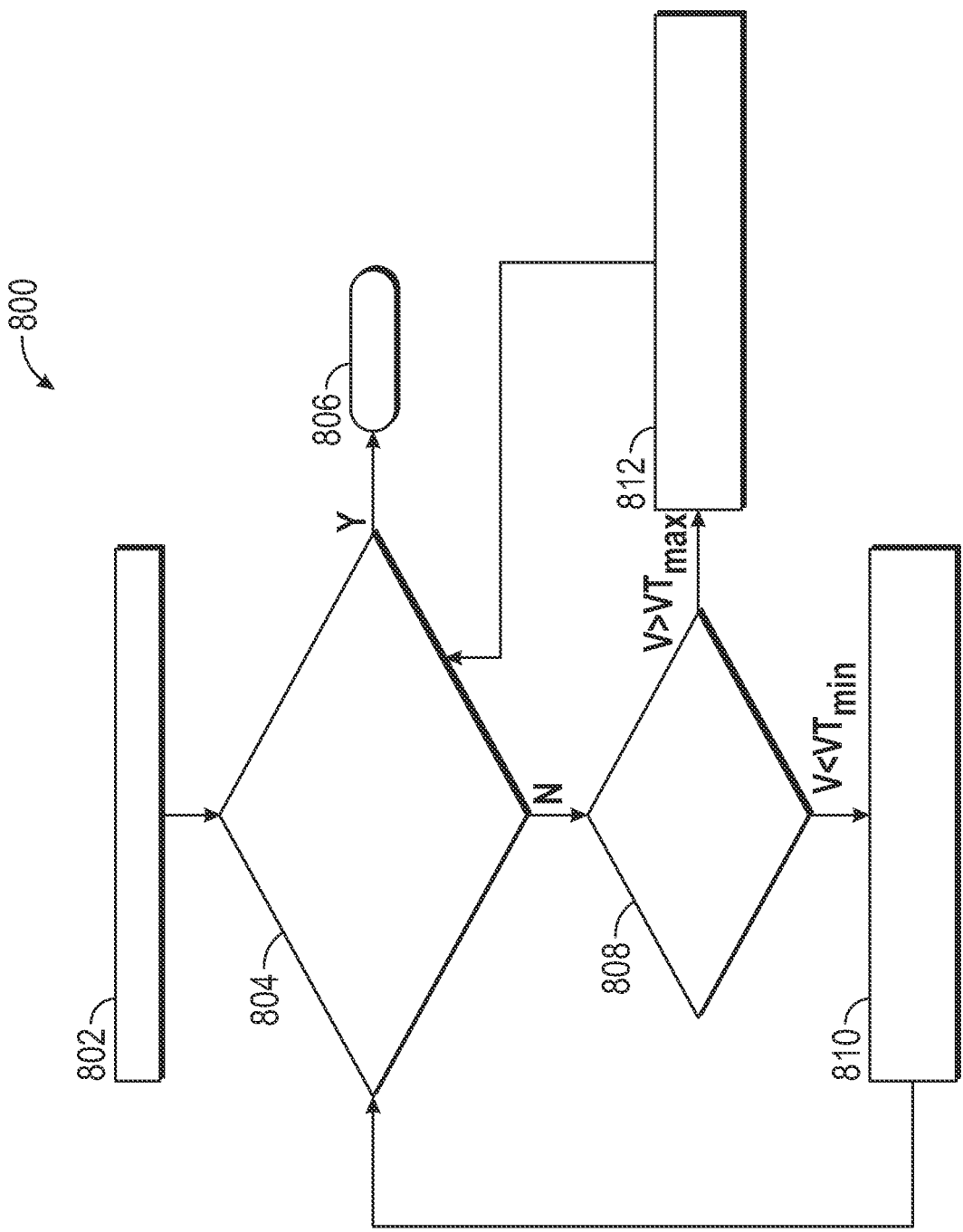
FIG. 8 shows a flowchart of a method for maintaining a reference voltage at a nominal value.

FIG. 8 shows a flowchart 800 of a method for maintaining a reference voltage at a nominal value. In box 802, the battery is charged. In box 804, a measurement is obtained to determine whether the reference voltage falls within the acceptable range. This includes checking the reference voltage against a known potential of another electrode (i.e., either cathode 202 or anode 204). In one embodiment, the anode potential is used at the end of a charging event (i.e., when the anode electrode is in a fully lithiated state). Then the charge is held at a maximum voltage until the current has dropped below some threshold value. At this point, the anode is fully lithiated and exhibits a constant, reproducible electrochemical potential. Over the life of the cell, the anode voltage should always charge to the same end-of-charge state, so this can be used as an anchor point to check the reference potential.

If the voltage difference is within an acceptable range, then the method proceeds to box 806 in which the method is ended. If the voltage difference is outside of the acceptable range, the method proceeds to box 808.

In box 808, a determination is made whether the voltage difference is greater than the maximum voltage threshold 404 or less than the minimum voltage threshold 406. If the voltage difference is less than the minimum voltage threshold 404 ($VT_{min}$), the method proceeds to box 810. In box 810, lithium ions are removed from the reference electrode by discharging the reference electrode 206 to the cathode 202. From box 810, the method loops back to box 804. Returning to box 808, if the voltage difference is greater than the maximum voltage threshold 406 ($VT_{max}$), then the method proceeds to box 812. In box 812, lithium ions are added to the reference electrode by discharging the anode to the reference electrode 206. From box 812, the method loops back to box 804.

Figure 9:
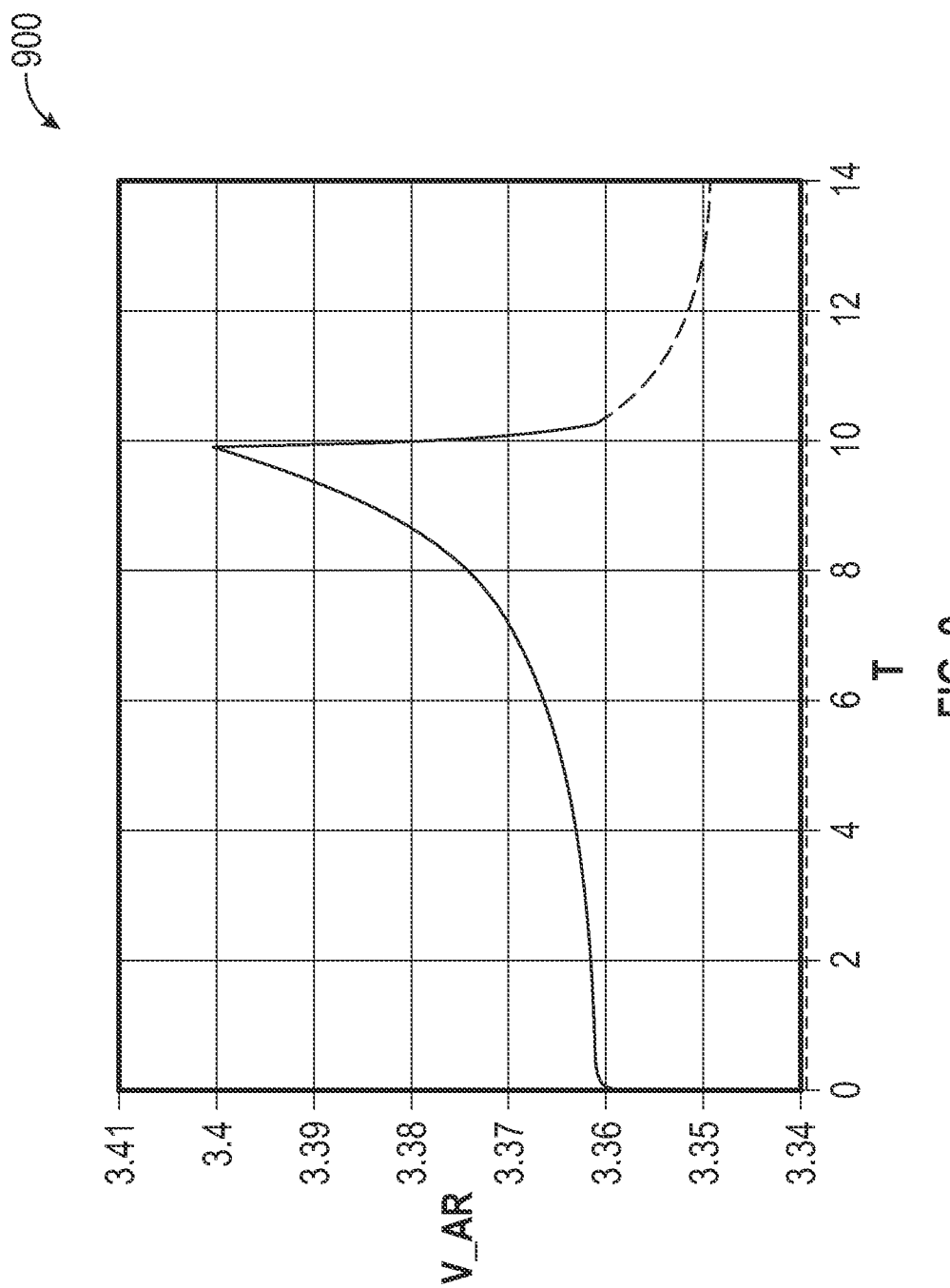
FIG. 9 shows a graph of an anode-reference voltage over time during a balancing step, in an illustrative embodiment.

FIG. 9 shows a graph 900 of an anode-reference voltage (V_AR) over time (T) during a balancing step, in an illustrative embodiment. Time is shown in hours along the abscissa and the anode-reference voltage is shown along the ordinate axis in volts (V). The processor 506 triggers the charging circuit 504 when the anode-reference voltage falls at or below 3.345 V. At time t=0 hours, the anode-reference voltage is 3.345 V, which triggers a lithium balancing step. During the balancing step, the reference electrode 206 is discharged to the cathode 202, causing the anode-reference voltage to increase. The charging circuit 504 stops discharging when the anode-reference potential reaches 3.40 V at about t=10 hours. The anode-reference voltage then drops to reach a final equilibrium voltage (of about 3.35 V) at about t=14 hours. Thus, the balancing device 106 is able to detect a non-optimal reference voltage, commence a balancing step, and end the balancing step at an appropriate time to achieve a desired reference voltage.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof

What is claimed is:

1. A method of controlling a state of charge of a reference electrode in a battery, comprising:
   charging an anode of the battery to a fully lithiated state, the battery including the anode, a cathode and the reference electrode between the anode and the cathode;
   obtaining a measurement of an anode-reference voltage of the battery with the anode in the fully lithiated state;
   commencing a discharging of the reference electrode to the cathode to remove a lithium ion from the reference electrode to the cathode when the anode-reference voltage falls below a minimum voltage threshold;
   monitoring the anode-reference voltage during the discharging of the reference electrode to the cathode; and
   ending the discharging when the anode-reference voltage reaches a selected voltage.

2. The method of claim 1, wherein the reference electrode is made of Lithium-Ion Phosphate (LiFePO4).

3. The method of claim 1, further comprising adjusting the anode-reference voltage when the measurement is outside of a range defined about a nominal voltage.

4. The method of claim 3, wherein the range is defined by a maximum voltage threshold and the minimum voltage threshold.

5. The method of claim 1, wherein adjusting the anode-reference voltage further comprises at least one of: (i) adding a lithium ion to the reference electrode; and (ii) removing the lithium ion from the reference electrode.

6. The method of claim 1, wherein adjusting the anode-reference voltage further comprises at least one of: (i) charging the reference electrode from the anode of the battery; (ii) charging the reference electrode from the cathode of the battery; and (iii) discharging the reference electrode to the anode of the battery.

7. The method of claim 1, further comprising determining at least one of a cathode voltage and an anode voltage using the anode-reference voltage.

8. A balancing device for controlling a state of charge of a reference electrode in a battery, comprising:
   a measurement circuit configured to obtain a measurement of an anode-reference voltage between and anode of the battery and the reference electrode; and
   a charging circuit configured to:
   charge the anode of the battery to a fully lithiated state;
   obtain a measurement of the anode-reference voltage of the battery with the anode in the fully lithiated state;

commence a discharging of the reference electrode to a cathode of the battery to remove a lithium ion from the reference electrode to the cathode when the anode-reference voltage falls below a minimum voltage threshold;

monitor the anode-reference voltage during the discharging of the reference electrode to the cathode; and end the discharging when the anode-reference voltage reaches a selected voltage.

9. The balancing device of claim 8, wherein the reference electrode is made of Lithium-Ion Phosphate (LiFePO4).

10. The balancing device of claim 8, wherein the charging circuit is configured to adjust the anode-reference voltage when the measurement is outside of a range defined about a nominal voltage.

11. The balancing device of claim 10, wherein the range is defined by a maximum voltage threshold and the minimum voltage threshold.

12. The balancing device of claim 8, wherein the charging circuit is configured to adjust the anode-reference voltage by performing at least one of: (i) adding a lithium ion to the reference electrode; and (ii) removing the lithium ion from the reference electrode.

13. The balancing device of claim 8, wherein the charging circuit is configured to adjust the anode-reference voltage by performing at least one of: (i) charging the reference electrode from the anode of the battery; (ii) charging the reference electrode from the cathode of the battery; and (iii) discharging the reference electrode to the anode of the battery.

14. The balancing device of claim 8, wherein the measurement circuit is configured to determine at least one a cathode voltage and an anode voltage using the anode-reference voltage.

15. A vehicle, comprising:

a battery having an anode, a cathode, and a reference electrode between the anode and the cathode; and a balancing device for controlling a state of charge of the reference electrode, the balancing device comprising:

a measurement circuit configured to monitor an anode-reference voltage between the anode and the reference electrode; and a charging circuit configured to charge the anode of the battery to a fully lithiated state and adjust the anode-reference voltage based on the measurement with the anode in the fully lithiated state, wherein the charging circuit commences a discharging of the reference electrode to the cathode to remove a lithium ion from the reference electrode to the cathode when the anode-reference voltage falls below a minimum voltage threshold and ends the discharging when the anode-reference voltage reaches a selected voltage.

16. The vehicle of claim 15, wherein the reference electrode is made of Lithium-Ion Phosphate (LiFePO4).

17. The vehicle of claim 15, wherein the charging circuit is configured to adjust the anode-reference voltage when the measurement is outside of a range defined by a maximum voltage threshold and the minimum voltage threshold about a nominal voltage.

18. The vehicle of claim 15, wherein the charging circuit is configured to adjust the anode-reference voltage by performing at least one of: (i) adding the lithium ion to the reference electrode; and (ii) removing the lithium ion from the reference electrode.

19. The vehicle of claim 15, wherein the charging circuit is configured to adjust the anode-reference voltage by performing at least one of: (i) charging the reference electrode from the anode of the battery; (ii) charging the reference electrode from the cathode of the battery; and (iii) discharging the reference electrode to the anode of the battery.

20. The vehicle of claim 15, wherein the measurement circuit is configured to determine at least one a cathode voltage and an anode voltage using the anode-reference voltage.

\* \* \* \* \*